United States Patent [19]
Iwata

[11] Patent Number: 5,939,902
[45] Date of Patent: Aug. 17, 1999

[54] INTEGRATING CIRCUIT INTERNALLY INCLUDED IN SEMICONDUCTOR DEVICE

[75] Inventor: Hiromitsu Iwata, Kanagawa, Japan

[73] Assignee: NEC Corporation, Tokyo, Japan

[21] Appl. No.: 09/015,985

[22] Filed: Jan. 30, 1998

[30] Foreign Application Priority Data

Jan. 30, 1997 [JP] Japan .................................. 9-016783

[51] Int. Cl.⁶ .................................................. G01R 29/02
[52] U.S. Cl. ............................................... 327/14; 327/77
[58] Field of Search ................................. 327/14, 63, 77, 327/78, 336, 344

[56] References Cited

U.S. PATENT DOCUMENTS

| | | | |
|---|---|---|---|
| 5,491,421 | 2/1996 | Katsuie | 324/452 |
| 5,519,352 | 5/1996 | Mo | 327/345 |
| 5,581,206 | 12/1996 | Chevallier et al. | 327/143 |
| 5,596,291 | 1/1997 | Runas | 327/108 |
| 5,625,305 | 4/1997 | Hwang | 327/78 |
| 5,744,984 | 4/1998 | Drapac et al. | 327/89 |
| 5,748,023 | 5/1998 | Hassner et al. | 327/336 |
| 5,864,219 | 1/1999 | Fink | 320/132 |

FOREIGN PATENT DOCUMENTS

| | | |
|---|---|---|
| 61-8371 | 1/1986 | Japan . |
| 61-182332 | 8/1986 | Japan . |
| 64-44624 | 2/1989 | Japan . |
| 5-191289 | 7/1993 | Japan . |

*Primary Examiner*—Kenneth B. Wells
*Assistant Examiner*—Maria Hasanzadah
*Attorney, Agent, or Firm*—Foley, Hoag & Eliot LLP

[57] ABSTRACT

An integrating circuit internally included in a semiconductor device includes a constant voltage circuit 11 for generating a predetermined constant voltage VREF, and a voltage-to-current converting circuit 12 for converting the voltage VREF into a constant current I0, which is supplied to a capacitor 15 externally connected to a connection terminal CPT. In order to detect an integral potential charged in the capacitor 15, a voltage comparator 14 having one input connected to the capacitor connection terminal CPT and the other input connected to an input terminal IN for receiving a signal VIN to be measured, inverts its output voltage when both the input voltages becomes consistent with each other. The integrating circuit also includes a switching circuit 13 having an input connected to an output terminal of the constant voltage circuit 11, an output connected to the capacitor connection terminal CPT. When this switching circuit 13 is activated in response to a control signal, the switching circuit 13 forcibly maintains a potential of the capacitor at a constant potential obtained from the constant voltage circuit. When the switching circuit 13 is deactivated in response to the control signal, the switching circuit 13 causes the capacitor to be charged from the constant potential with the constant current I0 supplied from the voltage-to-current converting circuit 12.

27 Claims, 3 Drawing Sheets

INTEGRATING CIRCUIT INTERNALLY INCLUDED IN SEMICONDUCTOR DEVICE

BACKGROUND OF THE INVENTION

1. Field of the Invention

The present invention relates to an integrating circuit internally included in a semiconductor device, and more specifically to an integrating circuit having an improved precision in an integral time.

2. Description of Related Art

An integrating circuit internally included in a semiconductor device is used for example as one of timer circuits provided in a microcomputer. Referring to FIG. 1, there is shown a block diagram showing one example of the prior art integrating circuit.

The shown integrating circuit includes an input terminal IN for receiving a signal VIN to be measured, a connection terminal CPT to which an integrating capacitor (not shown) is to be externally connected, a constant voltage circuit 41 for generating a predetermined constant voltage VREF, a voltage-to-current converting circuit 42 for converting the voltage VREF of the constant voltage circuit 41 into a current IREF or I0, which is supplied to the capacitor (not shown) externally connected to the connection terminal CPT. In order to detect an integral potential charged in the capacitor (not shown) connected to the connection terminal CPT, the shown integrating circuit also includes a voltage comparator 43 having one input connected to the capacitor connection terminal CPT and the other input connected to the input terminal IN, to compare both input voltages and to invert its output voltage to an output terminal OUT when both the input voltages becomes consistent with each other. Furthermore, the shown integrating circuit includes an NPN transistor NSW having a collector connected to the capacitor connection terminal CPT and an emitter connected to ground, and so configured to be brought into either a saturated conductive condition or a cutoff condition, in response to a control voltage VCTL supplied to a base of the transistor, and a control circuit 44 connected to a control terminal CTL for supplying the control voltage VCTL to the base of the transistor NSW in accordance with a control signal externally supplied to the control terminal CTL.

Referring to FIG. 2, there is shown a timing chart illustrating an operation of the prior art integrating circuit shown in FIG. 1. If the control circuit 44 is externally controlled through the control terminal CTL, the control voltage signal VCTL outputted from the control circuit 44 is caused to change from a logical low level to a logical high level at a timing t=$t_0$. In response to this level change of the control voltage signal VCTL, the transistor NSW is brought from the saturated conductive condition into the cutoff condition. As a result, the output current I0 of the constant current outputted from the voltage-to-current converting circuit 42 starts to be supplied through the connection terminal CPT to the capacitor (not shown), so that the capacitor starts to be charged.

A charged potential VC of the capacitor gradually elevates. As a result, at a timing t=$t_1$ where the charged potential VC reaches the voltage VIN to be measured which is a target for comparison, the output of the voltage comparator 43 inverts so that a high level is outputted to the output terminal OUT. On the other hand, the charged potential VC continues to elevate without dropping, and if the charged potential VC reaches the output potential of the voltage-to-current converting circuit 42, the charged potential Vc continues to maintain the output potential of the voltage-to-current converting circuit 42.

Here, assuming that a length of time from the moment ($t_0$) the control voltage signal VCTL changed from the low level to the high level to the moment ($t_1$) the output of the voltage comparator 43 changed from the low level to the high level, is "T", a capacitance of the capacitor is "C", and a collector-emitter voltage of the transistor NSW in the saturated conductive condition is "VCEsat", T can be expressed as follows:

$$T = C \times (VIN - VCEsat)/I0 \qquad (1)$$

Namely, the magnitude of the potential of the signal VIN to be measured can be grasped as the length of time T.

In the prior art integrating circuit as mentioned above, however, the saturation voltage VCEsat of the transistor NSW is involved in precision of the integral time. But, not only the saturation voltage of the transistor NSW is influenced by variation in diffusion in a manufacturing process, but also it has a temperature dependency. Therefore, in order to elevate the precision of the integrating circuit, the size of the transistor NSW must be enlarged.

However, this is disadvantageous, because enlargement of the transistor size in order to elevate the precision of the integrating circuit, is contrary to the trend of semiconductor devices in which the semiconductor device is further micro-miniaturized and the integration density is further elevated with advancement of micro-fabrication in the semiconductor manufacturing process.

SUMMARY OF THE INVENTION

Accordingly, it is an object of the present invention to provide an integrating circuit which has overcome the above mentioned defect of the conventional one.

Another object of the present invention is to provide an integrating circuit having an improved precision in an integral time, internally included in a semiconductor device and of the type of calculating the integral time by measuring a charged voltage of a capacitor having a known capacitance and charged by a constant current, with no increase in the size of a transistor for controlling the charging of the capacitor, which was required in the prior art for preventing influence of variation in a saturation voltage of the transistor and influence of temperature variation.

The above and other objects of the present invention are achieved in accordance with the present invention by an integrating circuit comprising an input terminal for receiving a signal to be measured, an output terminal, a connection terminal to which an integrating capacitor is to be externally connected, a constant voltage circuit for generating a first constant voltage, a voltage-to-current converting circuit for converting the first constant voltage into a constant current which is supplied through the connection terminal to the integrating capacitor, a voltage comparator having one input connected to the connection terminal and the other input connected to the input terminal to compare a potential of the integrating capacitor with a potential of the signal to be measured, and to invert its output voltage to the output terminal when both the potentials become consistent with each other, a switching means having an input connected to the constant voltage circuit and an output connected to the connection terminal and having a charging means, the switching means being controlled by a control signal externally supplied through a control terminal in such a manner that when the switching means is activated by the control signal, the charging means charges the integrating capacitor connected to the connection terminal to a predetermined constant potential, and when the switching means is deactivated by the control signal, the switching means isolates the charging means from the connection terminal, so that the integrating capacitor is charged from the second constant voltage with the constant current.

Specifically, when the switching means is activated by the control signal, the charging means supplies to the connection terminal, as the predetermined constant potential, a second constant voltage which is obtained from the constant voltage circuit and which is smaller than the first constant voltage.

In addition, a length of time from the moment the switch means is deactivated by the control signal to the moment the voltage comparator inverts its output voltage, becomes an integral time.

In a specific embodiment, the switching means includes a current mirror circuit formed of a pair of first and second PNP transistors having their bases connected in common and their emitters connected to a high voltage supply line, the base and a collector of the first PNP transistor being connected in common to a collector of a first NPN transistor, which has an emitter connected through a first resistor to the ground line, and a third PNP transistor connected in parallel to the first PNP transistor and having a base connected to the control terminal. The charging means includes a feedback operational amplifier having a power input terminal and a ground terminal connected to a collector of the second PNP transistor and the ground line, respectively, the feedback operational amplifier having a non-inverting input connected to receive the second constant voltage obtained by voltage-dividing the first constant voltage from the constant voltage circuit, and an inverting input connected to an output of the feedback operational amplifier, the output of the feedback operational amplifier being connected to the connection terminal, a current output terminal of the voltage-to-current converting circuit and the one input of the voltage comparator.

The predetermined constant potential, which becomes a charging start potential of the integrating capacitor, is given by the output of the feedback operational amplifier.

The above and other objects, features and advantages of the present invention will be apparent from the following description of preferred embodiments of the invention with reference to the accompanying drawings.

DESCRIPTION OF THE PREFERRED EMBODIMENT

Figure 3:
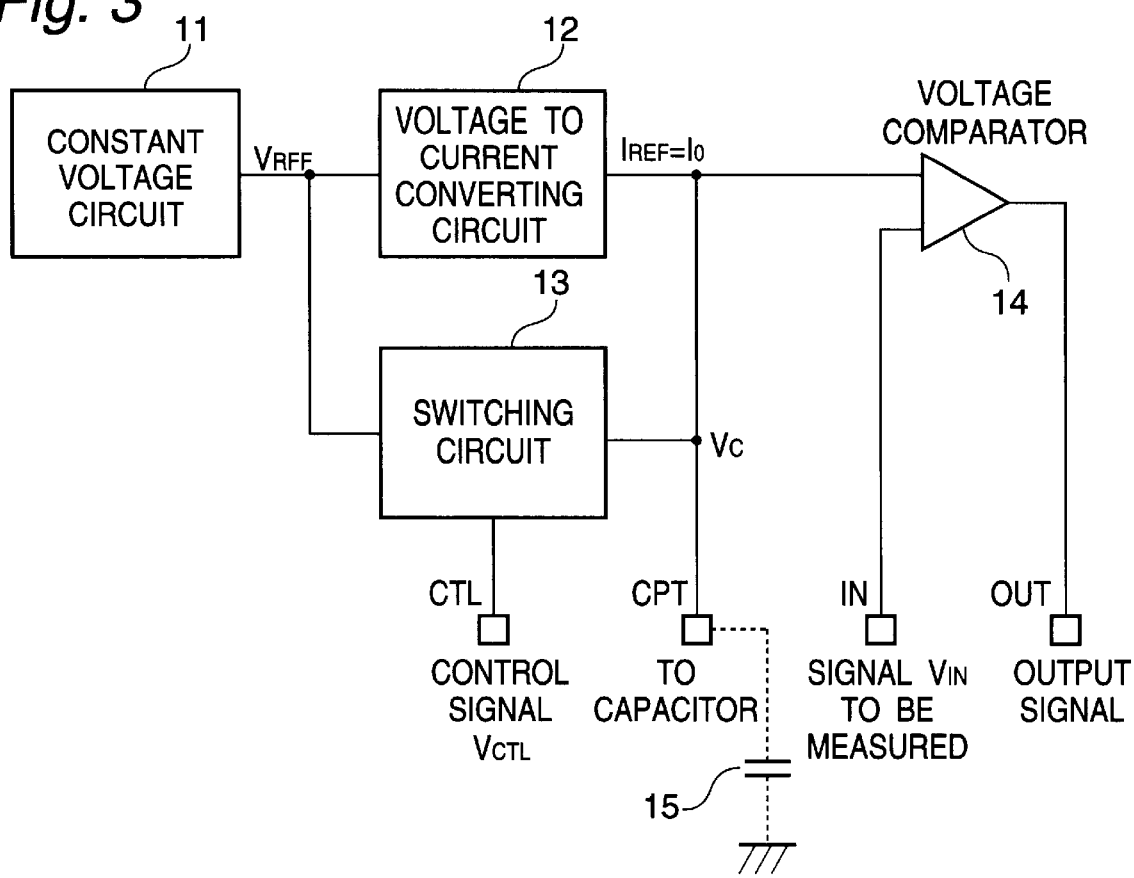
FIG. 3 is a block diagram showing one embodiment of the integrating circuit in accordance with the present invention.

Referring to FIG. 3, there is shown a block diagram showing one embodiment of the integrating circuit in accordance with the present invention.

The shown embodiment includes an input terminal IN for receiving a signal VIN to be measured, a connection terminal CPT to which an integrating capacitor 15 (shown in dotted line) is to be externally connected, a constant voltage circuit 11 for generating a predetermined constant voltage VREF, a voltage-to-current converting circuit 12 for converting the voltage VREF of the constant voltage circuit 11 into a constant current IREF or I0, which is supplied to the capacitor 15 externally connected to the connection terminal CPT. In order to detect an integral potential charged in the capacitor 15 connected to the connection terminal CPT, the shown embodiment also includes a voltage comparator 14 having one input connected to the capacitor connection terminal CPT and the other input connected to the input terminal IN, to compare a potential of the integrating capacitor with a potential of the signal to be measured, and to invert its output voltage to the output terminal when both the potentials becomes consistent with each other. Furthermore, the shown embodiment includes a switching circuit 13 having an input connected to an output terminal of the constant voltage circuit 11, an output connected to the capacitor connection terminal CPT and a control input connected to a control terminal CTL. This switching circuit 13 is so configured to be brought into either a conductive condition or a non-conductive condition, in response to a control voltage signal externally supplied through the control terminal CTL.

Figure 1:
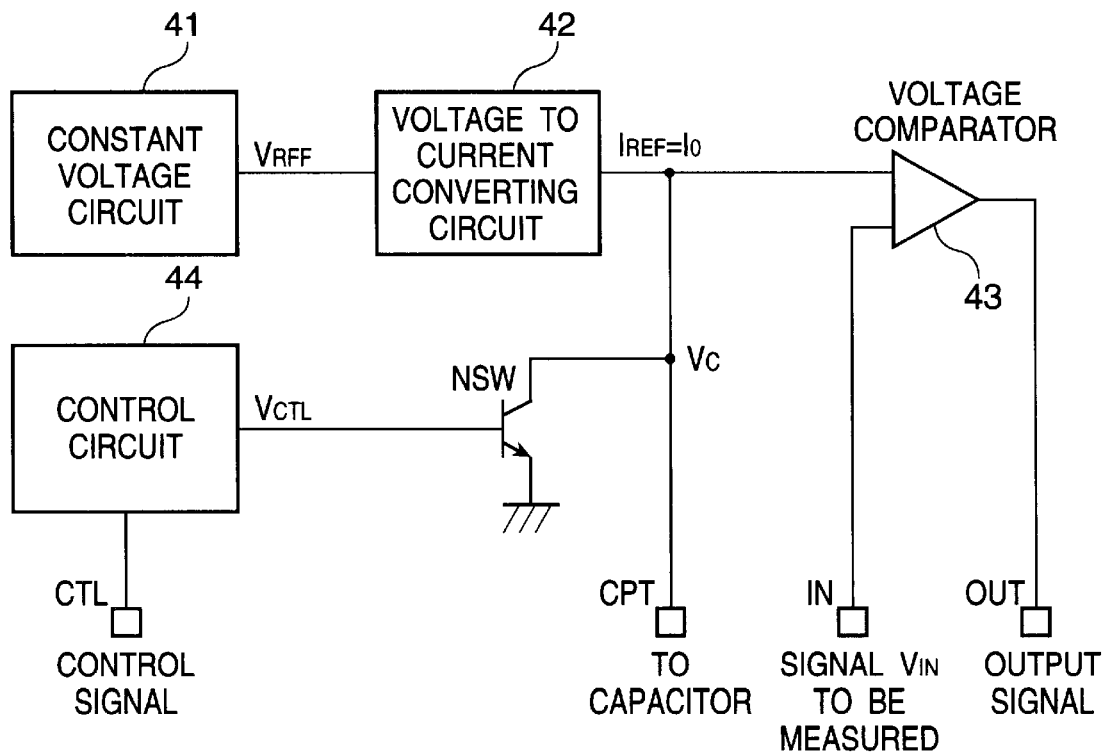
FIG. 1 is a block diagram showing one example of the prior art integrating circuit.
Figure 2:
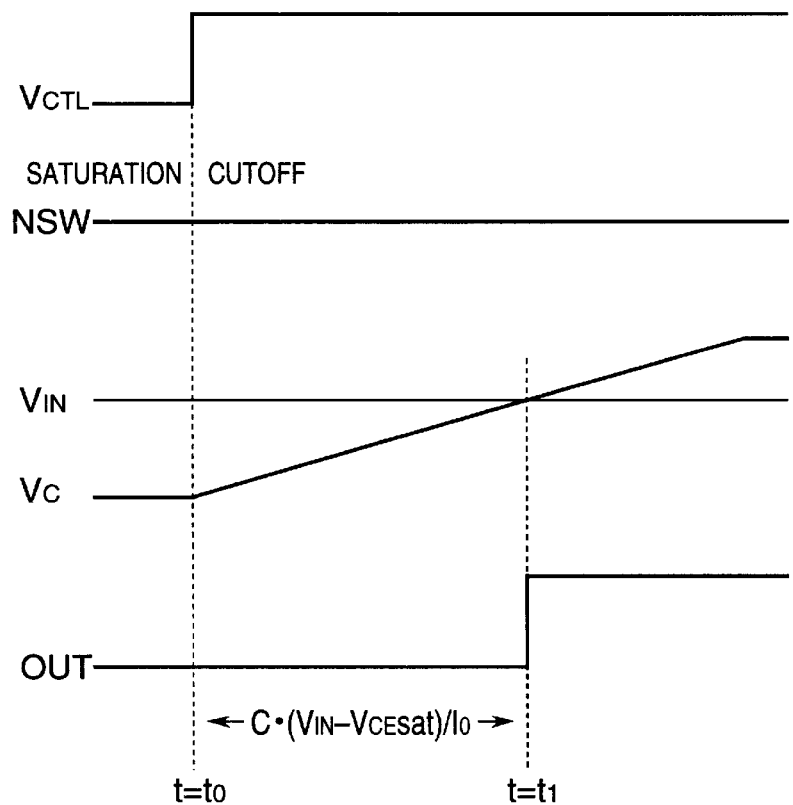
FIG. 2 is a timing chart illustrating an operation of the prior art integrating circuit shown in FIG. 1.

As seen from comparison between FIG. 1 and FIG. 3, the embodiment is different from the prior art integrating circuit shown in FIG. 1 in a switching means for controlling the charging of the externally connected capacitor.

Figure 4:
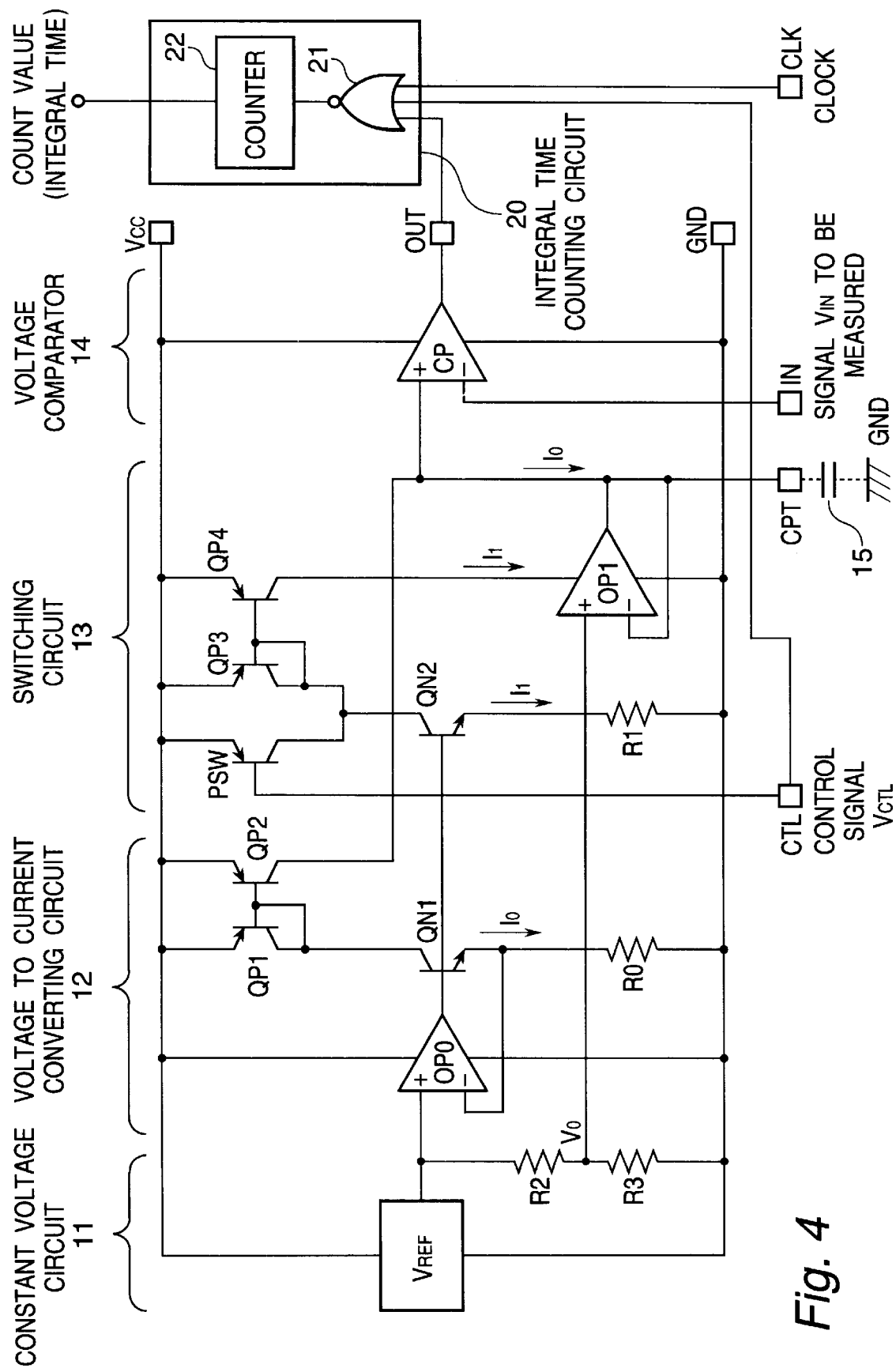
FIG. 4 is a detailed circuit diagram of the integrating circuit shown in FIG. 3.

Referring to FIG. 4, there are shown a detailed circuit diagram of the integrating circuit shown in FIG. 3, and a logic circuit diagram of an associated integral time counting circuit. The constant voltage circuit 11 is connected between a high voltage supply line VCC and a ground line GND, and having the output for the predetermined constant voltage VREF, connected through series-connected resistors R2 and R3 to the ground line GND. The series-connected resistors R2 and R3 constitutes a voltage dividing circuit, and the divided voltage V0 is outputted from a connection node between the resistors R2 and R3.

The voltage-to-current converting circuit 12 includes a current mirror circuit formed of a pair of PNP transistors QP1 and QP2 having their bases connected in common and their emitters connected to the high voltage supply line VCC. The base and a collector of the PNP transistor QP1 are connected in common to a collector of an NPN transistor QN1, and an emitter of the NPN transistor QN1 is connected through a resistor R0 to the ground line GND. A collector of the PNP transistor QP2 constitutes an current output of the voltage-to-current converting circuit 12, and is connected to the capacitor connection terminal CPT. The voltage-to-current converting circuit 12 also includes a feedback operational amplifier OP0 having an output connected to a base of the NPN transistor QN1, an inverting input (−) connected to the emitter of the NPN transistor QN1, and a non-inverting input (+) connected to the output of the predetermined constant voltage VREF, of the constant voltage circuit 11. A power input terminal and a ground terminal of this operational amplifier OP0 are connected to the high voltage supply line VCC and the ground line GND, respectively.

The switching circuit 13 includes a current mirror circuit formed of a pair of PNP transistors QP3 and QP4 having their bases connected in common and their emitters connected to the high voltage supply line VCC. The base and a collector of the PNP transistor QP3 are connected in common to a collector of an NPN transistor QN2, which has an emitter connected through a resistor R1 to the ground line GND and a base connected to the output of the operational amplifier OP0. The switching circuit 13 also includes a PNP transistor PSW connected in parallel to the PNP transistor QP3. Namely, an emitter and a collector of the PNP transistor PSW are connected to the emitter and the collector of the PNP transistor QP3, respectively. A base of the PNP transistor PSW is connected to the control terminal CTL. Further, the switching circuit 13 includes a feedback operational amplifier OP1 having a power input terminal and a ground terminal connected to a collector of the PNP transistor QP4 and the ground line GND, respectively. This feedback operational amplifier OP1 has a non-inverting input (+) connected to the connection node between the series-connected resistors R2 and R3 (namely, a divided voltage (V0) output terminal of the voltage dividing circuit (R2+R3) connected to the output of the constant voltage circuit 11) and an inverting input (−) connected to an output of the operational amplifier OP1 itself. The output of the operational amplifier OP1 is also connected to the capacitor connection terminal CPT, the current output of the voltage-to-current converting circuit 12 (namely, the collector of the PNP transistor QP2) and a non-inverted input (+) of the voltage comparator 14, which has an inverting input (−) connected to the input terminal IN.

The associated integral time counting circuit, generally designated with Reference Numeral 20 in FIG. 4, includes a NOR gate 21 having a first input connected to the control terminal CTL, a second input connected to the output terminal OUT and a third input connected to a clock terminal CLK for receiving a clock, and a counter 22 having an input connected to an output of the NOR gate 21 and an output for outputting a count value as an integral time.

Now, an operation of the above mentioned integrating circuit will be described with reference to FIGS. 3 and 4 and also FIG. 5 which is a timing chart illustrating the operation of the integrating circuit shown in FIGS. 3 and 4.

In a normal operating condition, since the output voltage VREF of the constant voltage circuit 11 is connected to the non-inverted input (+) of the feedback operational amplifier OP0, the output voltage of this feedback operational amplifier OP0 is fed back to the inverting input (−) of the feedback operational amplifier OP0, through the emitter of the NPN transistor QN1 having the base driven with the output voltage of the feedback operational amplifier OP0. Therefore, an emitter potential of the NPN transistor QN1 is converted into a current by action of the resistor R0 connected between the emitter of the NPN transistor QN1 and the ground GND. This current is I0 and is expressed by I0=VREF/R0. This current I0 is supplied from the collector of the PNP transistor QP1 to the NPN transistor QN1.

The collector current I0 of the NPN transistor QN1 is copied to the collector current of the PNP transistor QP2 by action of the current mirror circuit formed of the PNP transistors QP1 and QP2, so that the current I0 supplied from the collector current of the PNP transistor QP2 is supplied to the capacitor connection terminal CPT to charge the capacitor 15 connected to the capacitor connection terminal CPT.

Simultaneously, the predetermined constant voltage VREF supplied from the constant voltage circuit 11 is divided by the voltage dividing circuit of the resistors R2 and R3 into the divided voltage V0, which is supplied to the non-inverting input (+) of the feedback operational amplifier OP1.

Figure 5:
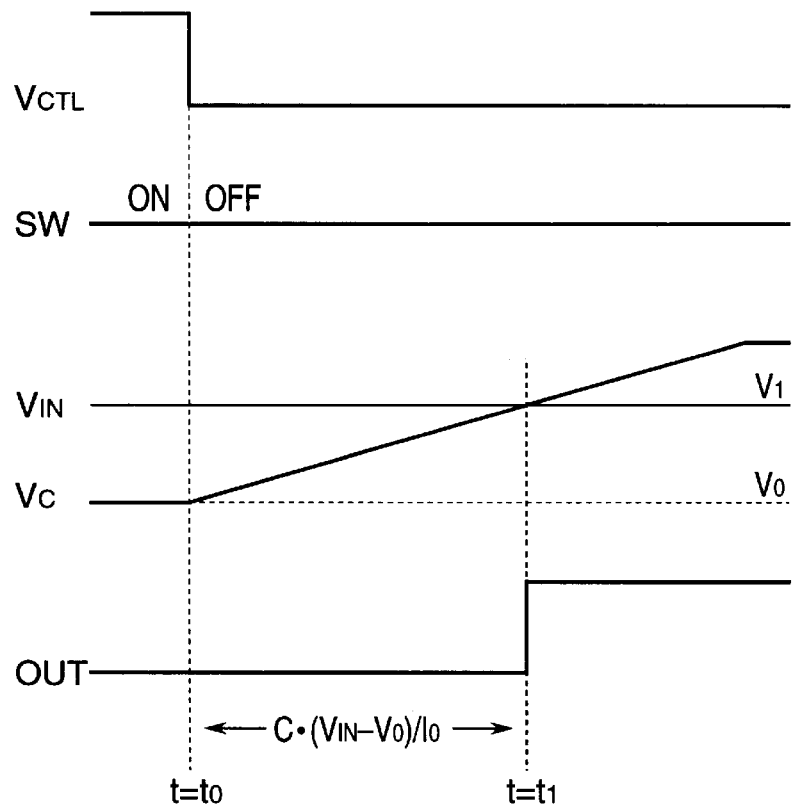
FIG. 5 is a timing chart illustrating an operation of the integrating circuit shown in FIGS. 3 and 4.

Here, in the timing chart of FIG. 5, the left side of the line of t=t_0 indicates a conductive condition (ON) of the switching circuit 13, and the right side of the line of t=t_0 indicates a non-conductive condition (OFF) of the switching circuit 13.

Before the time t=t_0, namely, in a time t<t_0, the control voltage VCTL externally supplied to the control terminal CTL is at a high level, so that the PNP transistor PSW is the non-conductive condition, and therefore, the PNP transistors QP3 and QP4 of the current mirror circuit are in an active condition, namely, in an operating condition.

Furthermore, since the NPN transistor QN2 connected between the collector of the PNP transistor QP3 and the resistor R1 is driven by the output voltage of the feedback operational amplifier OP0 of the voltage-to-converting circuit 12, an emitter potential of the NPN transistor QN2 is converted into a current by action of the resistor R1. This current, called "I1" hereinafter, is expressed by I1=VREF/R1, and is supplied from the collector of the PNP transistor QP3 to the NPN transistor QN2.

The collector current of the PNP transistor QP3 is copied to the collector current of the PNP transistor QP4 by action of the current mirror circuit formed of the PNP transistors QP3 and QP4, so that the current I1 supplied from the collector current of the PNP transistor QP4 is supplied to the feedback operational amplifier OP1 as a driving current.

Thus, the feedback operational amplifier OP1 connected between the collector current of the PNP transistor QP4 and the ground line GND is put into an active condition, namely, in an operating condition, since the current I1 supplied from the collector current of the PNP transistor QP4 is supplied to the power input terminal of the feedback operational amplifier OP1.

Accordingly, the output voltage V0 of the feedback operational amplifier OP1 is supplied to the capacitor connection terminal CPT, so that a potential of the capacitor 15 is maintained at V0.

Then, at the time t=t_0, the control voltage VCTL externally supplied to the control terminal CTL changes to a low level from the high level, so that the PNP transistor PSW is brought into the conductive condition, with the result that the PNP transistors QP3 and QP4 of the current mirror circuit are brought into a non-active condition, namely, in a non-operating condition. Therefore, the current I1 is no longer supplied from the collector current of the PNP transistor QP4 to the power input terminal of the feedback operational amplifier OP1, so that the feedback operational amplifier OP1 is put into a non-active condition, namely, in a non-operating condition, and the output of the feedback operational amplifier OP1 is put into a high impedance condition.

In this condition, the current I0 supplied from the collector of the transistor QP2 of the current mirror circuit in the voltage-to-current converting circuit 12, is supplied to the capacitor 15, so that the charging of the capacitor 15 starts. Since, at the time t<t_0, the potential of the capacitor 15 is maintained at the output voltage V_0 of the feedback operational amplifier OP1, the charging of the capacitor 15 starts from this voltage V0, and the potential of the capacitor 15 gradually elevates from this charging start voltage V0.

Form the time t_0 to the time t_1, the control voltage VCTL externally supplied to the control terminal CTL is maintained at the low level, the PNP transistor PSW is maintained in the conductive condition. Therefore, the PNP transistors QP3 and QP4 of the current mirror circuit are maintained in the non-active condition, and the current I1 is not supplied from the collector current of the PNP transistor QP4 to the power input terminal of the feedback operational amplifier OP1, so that the output of the feedback operational amplifier OP1 is maintained in the high impedance condition. Accordingly, the current I0 continues to be supplied to the capacitor 15 from the collector of the transistor QP2 of the current mirror circuit in the voltage-to-current converting circuit 12, so that the charging condition is maintained. Therefore, the potential of the capacitor 15 continue to elevate toward the voltage VIN of the signal to be measured, supplied to the signal input terminal IN.

At the time t=$t_1$, the potential of the capacitor 15 becomes consistent with the voltage VIN of the signal to be measured, supplied to the signal input terminal IN. The voltage comparator 14 detects this consistency, so that the output voltage of the voltage comparator 14 is inverted from the low level to the high level.

Namely, the moment the charged potential of the capacitor 15 just reaches the voltage VIN of the signal to be measured, can be grasped as the level transition of the output voltage of the voltage comparator 14.

In the integral time counting circuit 20, on the other hand, when the control signal VCTL becomes the low level, since the output of the voltage comparator 14 is also at the low level at that time, the clock signal CLK passes through the NOR gate 21, and therefore, is counted in the counter 22. The counter 22 continues to count up the clock CLK during a period in which both the control signal CTL and the output of the voltage comparator 14 are at the low level. When the output of the voltage comparator 14 becomes the high level, an output of the NOR gate 21 is fixed to the low level, so that the clock CLK is no longer supplied to the counter 22. Namely, the counter 22 stop its counting-up. Therefore, a count value of the counter 22 is indicative of a length of time from the moment the control signal VCTL becomes the low level to the moment the output of the voltage comparator becomes the high level.

The charged potential of the capacitor 15 at the time t=$t_1$, is called V1. This V1 can be expressed as follows:

$$V1 = V0 + (I0 \times t_1)/C \qquad (2)$$

Here, assuming that the potential of the signal to be measured is VIN, a length of time from the moment ($t_0$) the control signal VCTL changes from the high level to the low level to the moment ($t_1$) the output of the voltage comparator 14 changes from the low level to the high level, can be expressed as follows:

$$t_1 - t_0 = C \times (VIN - V0)/I0 \qquad (3)$$

Namely, the magnitude of the potential VIN of the signal to be measured can be grasped as the length of time.

After the time t=$t_1$, the charged potential of the capacitor 15 continues to elevate until it reaches the potential of the collector of the PNP transistor QP2. Then, the charged potential of the capacitor 15 maintains the potential of the collector of the PNP transistor QP2 until the control voltage VCTL inverts from the low level to the high level.

Now, a difference between the above mentioned integrating circuit and the prior art integrating circuit will be described.

First, influence of variation in the charging start potential of the capacitor to the precision of integration, namely, the precision of the detected integral time, will be discussed. Here, assume that a standard value of the charging start potential of the capacitor is "V0", a difference between the standard value and an upper limit value caused by variation in a diffusion process is "a", a difference between the standard value and a lower limit value caused by variation in a diffusion process is "b", a maximum value of the charging start potential is "V0+a", a minimum value of the charging start potential is "V0−b", a capacitance of the integrating capacitor is "C", the potential of the signal to be measured is "VIN", a standard value of the time length from the charging starting time of the integrating capacitor to the moment the charged potential just reaches the potential of the signal to be measured is "T(TYP)", a minimum value of this time length is "T(MIN)" and a maximum value of this time length is "T(MAX)". Under this assumption, the width of variation can be expressed as follows:

$$T(MAX)/T(TYP) = 1 + \{b/(VIN-V0)\} \qquad (4)$$

$$T(MIN)/T(TYP) = 1 - \{a/(VIN-V0)\} \qquad (5)$$

Next, the precision of integration in the same chip area, including the temperature characteristics, is specifically compared with the prior art.

Function blocks constituting the integrating circuit of the present invention include the constant voltage circuit 11, the voltage-to-current converting circuit 12 including the feedback operational amplifier OP0, the voltage comparator 14, and the switching circuit 13 including the feedback operational amplifier OP1. On the other hand, function blocks constituting the prior art integrating circuit include the constant voltage circuit 41, the voltage-to-current converting circuit 42 including the feedback operational amplifier OP0, the voltage comparator 43, and the switching transistor NSW.

Here, since the switching circuit newly added in the integrating circuit of the present invention can be sufficiently constructed of minimum size transistors, if the switching circuit is converted into the number of circuit elements, the switching circuit corresponds to 25 circuit elements. Accordingly, in order to realize the prior art integrated circuit in the same chip area, the area allocated to the switching transistor NSW in the prior art integrated circuit corresponds to a total area of the 25 minimum size transistors. Accordingly, the precision of the integral time will be discussed by comparing the variation in saturation voltage and the temperature characteristics of the switching transistor in the prior art integrating circuit based on this condition, with the variation and the temperature characteristics of the switching circuit in the integrating circuit of the present invention.

(A) Comparison in absolute precision

Assuming that VREF=1 V, VIN=1 V, I0=1 mA, the driver ratio of the switching transistor (ratio of collector current to base current in saturated condition) is 5, and the variation of the saturation voltage of the switching transistor in the prior art is V0 (=VCEsat)=0.05 V±0.01 V, the precision of the integral time can be expressed as follows:

$$T(MAX)/T(TYP) = 1.01 \ (+1\%) \qquad (6)$$

$$T(MIN)/T(TYP) = 0.99 \ (-1\%) \qquad (7)$$

On the other hand, assuming that VREF=1 V, VIN=1 V, I0=1 mA, and the variation of V0 caused by variation of the switching circuit is V0=0.05 V±0.002 V, the precision of the integral time can be expressed as follows:

$$T(MAX)/T(TYP) = 1.002 \ (+0.2\%) \qquad (8)$$

$$T(MIN)/T(TYP) = 0.998 \ (-0.2\%) \qquad (9)$$

(B) Comparison in temperature characteristics

Assuming that VREF=1 V, VIN=1 V, I0=1 mA, the driver ratio of the switching transistor is 5, and the temperature characteristics of the saturation voltage of the switching transistor in the prior art is 5000 ppm/°C., when Ta=25° C. (+60°C., −55° C.), it becomes V0 (=VCEsat)=0.05 V (+0.015 V, −0.014 V), and therefore, the precision of the integral time can be expressed as follows:

$$T(MAX)/T(TYP)=1.016\ (+1.6\%) \quad (10)$$

$$T(MIN)/T(TYP)=0.985\ (-1.5\%) \quad (11)$$

On the other hand, assuming that VREF=1 V, VIN=1 V, I0=1 mA, and the temperature characteristics of the switching circuit is 0.1 mV/°C., when Ta=25° C. (+60° C., −55° C.), it becomes V0=0.05 V (+0.006 V, −0.0055 V), and therefore, the precision of the integral time can be expressed as follows:

$$T(MAX)/T(TYP)=1.007\ (+0.7\%) \quad (12)$$

$$T(MIN)/T(TYP)=0.994\ (-0.6\%) \quad (13)$$

As will be apparent from the above, the integrating circuit in accordance with the present invention has the precision of the integral time elevated in comparison with the prior art integrating circuit.

As seen from the above, the integrating circuit in accordance with the present invention comprises a switching means responding to the control signal externally supplied from the control terminal, to selectively either supply or cut an output voltage of the constant voltage circuit to an integrating capacitor connection terminal, and a charging means for charging a capacitor connected to the integrating capacitor connection terminal, to a predetermined constant potential, when the switch means is activated. The charging means is so configured to maintain a potential of the capacitor at a constant voltage supplied from a constant voltage circuit by action of the switching means activated in response to the control signal, and to cause the capacitor to be charged with a predetermined constant current supplied from a voltage-to-current converting circuit when the switching means is deactivated in response to the control signal. Therefore, the potential of the capacitor at the integrating start time is set to the constant voltage supplied from the constant voltage circuit. Accordingly, since the capacitor starts to be charged from the constant voltage, it is possible to prevent variation of the integrating start potential of the integrating capacitor, with the result that it is possible to elevate a precision of time length from the integrating start time to the moment the charged potential reaches the potential to be compared.

In addition, since the integrating start potential is set to the constant voltage, it is no longer necessary to enlarge the size of the switching transistor which was required in the prior art, and therefore, it is not necessary to increase the chip area.

The invention has thus been shown and described with reference to the specific embodiments. However, it should be noted that the present invention is in no way limited to the details of the illustrated structures but changes and modifications may be made within the scope of the appended claims.

I claim:

1. An integrating circuit comprising an input terminal for receiving a signal to be measured, an output terminal, a connection terminal to which an integrating capacitor is to be externally connected, a constant voltage circuit for generating a first constant voltage, a voltage-to-current converting circuit for converting said first constant voltage into a constant current which is supplied through said connection terminal to said integrating capacitor, a voltage comparator having one input connected to said connection terminal and the other input connected to said input terminal to compare a potential of said integrating capacitor with a potential of said signal to be measured, and to invert its output voltage to said output terminal when both said potentials become consistent with each other, a switching means having an input connected to said constant voltage circuit and an output connected to said connection terminal and having a charging means, said switching means being controlled by a control signal externally supplied through a control terminal in such a manner that when said switching means is activated by said control signal, said charging means charges said integrating capacitor connected to said connection terminal to a predetermined constant potential, and when said switching means is deactivated by said control signal, said switching means isolates said charging means from said connection terminal, so that said integrating capacitor is charged from said second constant voltage with said constant current.

2. An integrating circuit claimed in claim 1 wherein when said switching means is activated by said control signal, said charging means supplies to said connection terminal, as said predetermined constant potential, a second constant voltage which is obtained from said constant voltage circuit and which is smaller than said first constant voltage.

3. An integrating circuit claimed in claim 2 further including an integral time counting means receiving said control signal and said output of said voltage comparator and counting an integral time which indicated by a length of time from the moment said switch means is deactivated by said control signal to the moment said voltage comparator inverts its output voltage.

4. An integrating circuit claimed in claim 2 wherein said switching means includes a current mirror circuit formed of a pair of first and second PNP transistors having their bases connected in common and their emitters connected to a high voltage supply line, said base and a collector of said first PNP transistor being connected in common to a collector of a first NPN transistor, which has an emitter connected through a first resistor to the ground line, and a third PNP transistor connected in parallel to said first PNP transistor and having a base connected to said control terminal, and wherein said charging means includes a feedback operational amplifier having a power input terminal and a ground terminal connected to a collector of said second PNP transistor and the ground line, respectively, said feedback operational amplifier having a non-inverting input connected to receive said second constant voltage obtained by voltage-dividing said first constant voltage from said constant voltage circuit, and an inverting input connected to an output of said feedback operational amplifier, said output of said feedback operational amplifier being connected to said connection terminal, a current output terminal of said voltage-to-current converting circuit and said one input of said voltage comparator.

5. An integrating circuit claimed in claim 4 wherein said predetermined constant potential, which becomes a charging start potential of said integrating capacitor, is given by said output of said feedback operational amplifier.

6. An integrating circuit claimed in claim 1 wherein said switching means includes a current mirror circuit formed of a pair of first and second PNP transistors having their bases connected in common and their emitters connected to a high voltage supply line, said base and a collector of said first PNP transistor being connected in common to a collector of a first NPN transistor, which has an emitter connected through a first resistor to the ground line, and a third PNP transistor connected in parallel to said first PNP transistor and having a base connected to said control terminal, and wherein said charging means includes a feedback operational amplifier having a power input terminal and a ground terminal connected to a collector of said second PNP transistor and the ground line, respectively, said feedback operational amplifier having a non-inverting input connected to receive said second constant voltage obtained by voltage-dividing said first constant voltage from said constant voltage circuit, and an inverting input connected to an output of said feedback operational amplifier, said output of said feedback operational amplifier being connected to said connection terminal, a current output terminal of said voltage-to-current converting circuit and said one input of said voltage comparator.

7. An integrating circuit claimed in claim 6 wherein said predetermined constant potential, which becomes a charging start potential of said integrating capacitor, is given by said output of said feedback operational amplifier.

8. An integrating circuit comprising:
    an input terminal for receiving a signal to be measured;
    an output terminal;
    a connection terminal to which an integrating capacitor is to be externally connected;
    a control terminal for receiving a control signal;
    a constant voltage circuit for generating a first constant voltage and a second constant voltage smaller than said first constant voltage;
    a voltage-to-current converting circuit for converting said first constant voltage into a constant current which is supplied through said connection terminal to said integrating capacitor;
    a voltage comparator having one input connected to said connection terminal and the other input connected to said input terminal to compare a potential of said integrating capacitor with a potential of said signal to be measured, and to invert its output voltage to said output terminal when both said potentials become consistent with each other; and
    means having an input connected to receive said second constant voltage, an output connected to said connection terminal and a control input connected to said control terminal, said means being controlled by said control signal supplied through said control terminal in such a manner that when said means is activated by said control signal, said means supplies said second constant voltage to said connection terminal to forcibly maintain said potential of said integrating capacitor connected to said connection terminal at said second constant voltage, and when said means is deactivated by said control signal, said means stops supplying said second constant voltage to said connection terminal, so that said integrating capacitor connected to said connection terminal starts to be charged from said second constant voltage with said constant current.

9. An integrating circuit claimed in claim 8 wherein said means includes:
    a current mirror circuit formed of a pair of first and second PNP transistors having their bases connected in common and their emitters connected to a high voltage supply line;
    a first NPN transistor having a collector connected in common to said base and a collector of said first PNP transistor, and an emitter connected through a first resistor to the ground line;
    a third PNP transistor connected in parallel to said first PNP transistor and having a base connected to said control terminal; and
    a feedback operational amplifier having a power input terminal and a ground terminal connected to a collector of said second PNP transistor and the ground line, respectively, said feedback operational amplifier having a non-inverting input connected to receive said second constant voltage, and an inverting input connected to an output of said feedback operational amplifier, said output of said feedback operational amplifier being connected to said connection terminal, so that when said third PNP transistor is put in a non-conductive condition by said control signal, said current mirror circuit operates to supply an electric power from said high voltage supply line to said feedback operational amplifier, and therefore, said feedback operational amplifier is put in an operating condition of outputting said second constant voltage to said connection terminal, and when said third PNP transistor is put in a conductive condition by said control signal, said current mirror circuit is put in a non-operating condition, and therefore, said feedback operational amplifier is also put in a non-operating condition to maintain said output of said feedback operational amplifier in a high impedance condition, whereby said integrating capacitor connected to said connection terminal starts to be charged from said second constant voltage with said constant current from said voltage-to-current converting circuit.

10. An integrating circuit, comprising:
    a constant voltage circuit that provides a constant voltage signal as an output thereof;
    a voltage to current converting circuit, coupled to said constant voltage circuit, said converting circuit providing an output current that varies according to an input voltage thereto;
    a switching circuit, coupled to a control signal and to said constant voltage circuit, said switching circuit providing, at an output thereof, a predetermined voltage in response to said control signal being in a first state and providing a predetermined current in response to said control signal being in a second state different than said first state, wherein said predetermined voltage is proportional to said constant voltage;
    a chargeable circuit element, coupled to said output of said switching circuit, a voltage of said chargeable circuit element increasing over time in response to said control signal switching from said first state to said second state; and
    a voltage comparator, coupled to said chargeable circuit element and to a reference voltage signal, said comparator providing a signal in response to said voltage across said chargeable circuit element exceeding said reference voltage.

11. An integrating circuit, according to claim 10, wherein said chargeable circuit element is a capacitor.

12. An integrating circuit, according to claim 10, wherein said voltage to current converting circuit includes a voltage follower having an input coupled to said constant voltage and having an output coupled to a resistor.

13. An integrating circuit, according to claim 10, wherein said predetermined current is provided by a current generator circuit coupled to a current mirror circuit.

14. An integrating circuit, according to claim 13, further comprising:
a voltage divider, coupled to said constant voltage signal to provide a proportion thereof as an input to said circuit that provides said predetermined voltage.

15. An integrating circuit, according to claim 14, wherein said circuit that provides a predetermined voltage is a voltage follower that receives power from a current source.

16. An integrating circuit, according to claim 15, wherein said control signal is coupled to a switching circuit that controls said current source to provide power to said voltage follower in response to said control signal being in said first state.

17. An integrating circuit, according to claim 16, wherein said voltage follower includes an op amp having an inverting input and a non-inverting input, wherein the voltage divider is coupled to the non-inverting input and the output of the op amp is coupled to the inverting input.

18. An integrating circuit, comprising:
chargeable means, for providing a voltage signal that increases as a function of time in response to a current being supplied thereto;
means for providing a predetermined current to said chargeable means;
means for providing a predetermined voltage to said chargeable means, said predetermined voltage being proportional to a constant voltage signal provided thereto;
switching means, for causing one of said predetermined current and said predetermined voltage to be selectively provided to said chargeable means in response to a control signal; and
output means, coupled to said chargeable means, for providing an output signal in response to said voltage signal of said chargeable means exceeds a predetermined threshold.

19. An integrating circuit, according to claim 18, wherein said chargeable means is a capacitor.

20. An integrating circuit, according to claim 18, wherein said means for providing a predetermined voltage includes a voltage divider coupled to said constant voltage signal.

21. An integrating circuit, according to claim 20, wherein said means for providing a predetermined voltage further includes a voltage follower coupled to said voltage divider.

22. An integrating circuit, according to claim 21, wherein said switching means includes means for selectively providing power to said voltage follower.

23. An integrating circuit, according to claim 22, wherein said means for selectively providing power includes a current generator with a current mirror coupled thereto, said current mirror providing current to power inputs of said voltage follower.

24. An integrating circuit, according to claim 18, wherein said means for providing a predetermined current includes a current generator and a current mirror coupled thereto.

25. An integrating circuit, according to claim 24, wherein said current generator includes a voltage follower coupled to said constant voltage and includes a resistor coupled to said voltage follower.

26. An integrating circuit, according to claim 18, wherein said output means includes a comparator that compares said voltage signal from said chargeable means to a threshold voltage signal.

27. A method of measuring time with a circuit, comprising:
a switching circuit causing a chargeable circuit element to have a predetermined starting voltage that is proportional to a constant voltage provided to the switching circuit;
the switching circuit causing a predetermined current to be provided to the chargeable circuit element, wherein the chargeable circuit element produces a voltage signal that increases as a function of time in response to the predetermined current being supplied thereto;
comparing the voltage signal of the chargeable circuit element to a reference voltage signal; and
providing an output signal in response to the voltage signal of the chargeable circuit element exceeding the reference voltage signal.

* * * * *